US006961014B2

(12) United States Patent  (10) Patent No.: US 6,961,014 B2
Toda  (45) Date of Patent: Nov. 1, 2005

(54) D/A CONVERTER

(75) Inventor: Akihiko Toda, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/853,896

(22) Filed: May 26, 2004

(65) Prior Publication Data

US 2005/0007268 A1 Jan. 13, 2005

(30) Foreign Application Priority Data

May 28, 2003 (JP) ..................... P.2003-151370

(51) Int. Cl.[7] .............................................. H03M 1/36
(52) U.S. Cl. ...................................... 341/159; 341/155
(58) Field of Search ................................ 341/155, 161, 341/158, 159, 156, 160, 120, 154, 144, 136, 145

(56) References Cited

U.S. PATENT DOCUMENTS 5,014,054 A    5/1991  Oshita
5,402,127 A    3/1995  Toda
5,977,898 A *  11/1999 Ling et al. ............... 341/144
6,255,978 B1 * 7/2001  Chang et al. ............. 341/155
6,567,026 B1 * 5/2003  Gorman .................... 341/154

FOREIGN PATENT DOCUMENTS

| JP | 61026330 | 2/1986 |
| JP | 1098322  | 4/1989 |
| JP | 6152425  | 5/1994 |
| JP | 11145835 | 5/1999 |

* cited by examiner

Primary Examiner—Brian Young
(74) Attorney, Agent, or Firm—Pillsbury Winthrop Shaw Pittman LLP

(57) ABSTRACT

A D/A converter formed on a semiconductor substrate includes a plurality of resistance strings which are provided between a low voltage terminal and a high voltage terminal, each of the resistance strings including a plurality of resistances connected in series. The resistance strings to be connected at odd-numbered positions are arranged on the substrate in order of increasing in a direction from a near side of the terminal to which the low voltage is applied to the far side thereof, and the resistance strings to be connected at even-numbered positions are arranged on the substrate in order of increasing in a direction from the far side of the terminal to the near side. A voltage at a junction point of the resistances constituting the resistance string is selectively output in accordance with input data to be converted.

9 Claims, 6 Drawing Sheets

D/A CONVERTER

BACKGROUND OF THE INVENTION

The present invention relates to a D/A converter wherein resistor strings are mounted on a semiconductor substrate.

FIG. 3 is a circuit diagram showing an example configuration for a conventional D/A converter of a resistor string type. The D/A converter receives data to be converted (hereinafter referred to "conversion data") as a digital signal of six bits, converts this digital signal into an analog signal, and outputs the analog signal. In FIG. 3, reference numerals 1 and 2 denote 3-bit decoders, respectively.

The 0-th bit D0 (LSB) to the second bit D2 of the conversion data are input to the input end of the decoder 1 through exclusive OR circuits 3 to 5, while the third bit D3 to the fifth bit D5 (MSB) of the conversion data are input to the input end of the decoder 2.

Voltage selection circuits 11 to 18 have the same structure, i.e., each includes a resistor string, which is formed by connecting nine resistors in series, and nine FETs (Field-Effect Transistors). In each of the voltage selection circuits 11 to 18 of the nine resistors constituting the resistor string, the uppermost resistor (the resistor at the top in FIG. 3) and the lowermost resistor (the resistor at the bottom in FIG. 3) have a resistance of R/2, while the other resistors have a resistance of R. The sources of the eight FETs are connected to the individual junction points of the resistors, and the drains of the FETs are connected in common to the source of the ninth FET.

The gates of the lowermost FETs of the voltage selection circuits 11 to 18 are connected to an output end 0 of the decoder 1, the gates of the second lowest FETs are connected to an output end 1 of the decoder 1, . . . , and the gates of the eighth lowest FETs are connected to an output end 7 of the decoder 1. The gates of the uppermost FETs of the voltage selection circuits 11 to 18 are respectively connected to output ends 0 to 7 of the decoder 2, and the drains of these FETs are connected to an output terminal OUT. A low voltage VR (−) is applied to an end P0 of the lowermost resistor of the voltage selection circuit 11, and a high voltage VR (+) is applied to an end P8 of the lowermost resistor of the voltage selection circuit 18. Between the end P0 of the voltage selection circuit 11, to which the low voltage VR (−) is applied, and the end P8 of the voltage selection circuit 18, to which the high voltage VR (+) is applied, the resistor strings of the voltage selection circuits 11 to 18 are connected through junction points P1, P2, P3, P4, P5, P6 and P7, while being doubled back in a ladder shape.

With this configuration, based on the 0-th bit D0 to the second bit D2 of the conversion data, the decoder 1 turns on one of the FETs provided for each of the resistor strings of the voltage selection circuits 11 to 18. For example, when the value of the 0-th bit D0 to the second bit D2 of the conversion data is represented by "010" (2), the third lowest FETs of the individual resistor strings are caused to be on. Further, the decoder 2 selectively turns on the uppermost FET of one of the voltage selection circuits 11 to 18. For example, when the value of the third bit D3 to the fifth bit D5 of the input conversion data is represented by "100" (4), the uppermost FET of the voltage selection circuit 15 is turned on. Therefore, in this example, when conversion data (digital data) is "100010", a voltage-dividing-point voltage at the junction point for the third and fourth lowest resistors of the resistor string of the voltage selection circuit 15 is output to the output terminal OUT as a voltage to be transformed.

When this D/A converter is mounted on a semiconductor substrate by using a semiconductor integrated circuit, multiple resistors are connected in series, and a divided voltage is selected and output. Therefore, it is desirable that there be no errors in the resistance values for the resistors constituting the resistor strings. However, in actuality, since because of the manufacturing process the sheet resistance distribution is not linear, the occurrence of errors in the resistances can not be avoided. Usually, in accordance with the locations of the resistors on the semiconductor substrate, an error occurs in that the resistances are varied with a specific gradient (monotonously increased or decreased). Especially, the column direction of the resistor strings is affected by this gradient. Therefore, as in the example shown in FIG. 3, assuming that the total resistance for the resistor string of the voltage selection circuit 11 is 8R, the total resistance for the resistor string of the voltage selection circuit 12 is 8R+Δ, the total resistance for the resistor string of the voltage selection circuit 13 is 8R+2Δ, . . . , and the total resistance for the resistor string of the voltage selection circuit 18 is 8R+7Δ. In this case, the total resistance for all the resistor strings is 64R+28Δ, and the average resistance for one resistor string is 8R+3.5Δ.

Therefore, assuming that the junction point of the voltage selection circuits 11 and 12, the junction point of the voltage selection circuits 12 and 13, . . . and the junction point of the voltage selection circuits 17 and 18 correspond to P1, P2, . . . and P7, it is preferable that, the resistances at the junction points P1, P2, . . . and P7 with respect to the point P0 represent "ideal values" as indicated in FIG. 4. However, the actual resistances at the junction points P1 to P7 are "resistance addition values", as indicated in FIG. 4. When the "ideal values" are subtracted from the "resistance addition values" in FIG. 4, the "differences" shown in FIG. 4 are obtained and are represented graphically as shown in FIG. 4. As is apparent from the graph in FIG. 4 for the D/A converter in FIG. 3, influences due to resistance errors having specific gradients (monotonous increases or decreases) are accumulated, the linearity (the linear accuracy of the output) has a characteristic represented by a convex shape (or a concave shape), and the linearity error becomes largest near the center of the graph.

In order to resolve this linearity error of the D/A converter due to the resistance error, techniques disclosed in patent documents 1 to 3 are well known. According to the techniques described in these documents, two types of resistor groups are arranged in opposite directions to offset the distribution of resistance errors. However, these techniques require twice as many resistors as are conventionally employed, and when a D/A converter is prepared by using a semiconductor integrated circuit, the dimensions of the circuit are twice as large.

According to a technique disclosed in patent document 4, the rows and the columns of resistors arranged in a matrix are divided by two to provide four resistor groups, and to offset the resistance errors, these resistor groups are connected in the shape of a cross. However, while for this circuit linearity errors are theoretically reduced to zero near the center, no other error offset effect can be obtained.

Patent Document 1
  JP-A-11-145835
Patent Document 2
  Japanese Patent No. 2864877
Patent Document 3
  JP-A-61-26330
Patent Document 4
  Japanese Patent No. 2737927

SUMMARY OF THE INVENTION

To resolve these shortcomings, one objective of the present invention is the provision of a D/A converter for which the reduction in linearity errors is greater than can be achieved conventionally, without increasing the dimensions of a circuit.

In order to solve the aforesaid object, the invention is characterized by having the following arrangement.

(1) A digital-to-analog converter formed on a semiconductor substrate comprising:

a plurality of resistance strings which are provided between a terminal to which a low voltage is applied and a terminal to which a high voltage is applied and are connected in series, each of the resistance strings including a plurality of resistances connected in series, wherein the resistance strings to be connected at odd-numbered positions are arranged on the substrate in order of increasing in a direction from a near side of the terminal to which the low voltage is applied to the far side thereof, and the resistance strings to be connected at even-numbered positions are arranged on the substrate in order of increasing in a direction from the far side of the terminal to the near side, wherein a voltage at a junction point of the resistances constituting the resistance string is selectively output in accordance with input data to be converted.

(2) The digital-to-analog converter according to (1), wherein the resistor strings at the odd-numbered positions and the resistor strings at the even-numbered positions are alternately arranged.

(3) The digital-to-analog converter according to claim 1, wherein the resistor strings at the odd-numbered positions and the resistor strings at the even-numbered positions are respectively arranged side by side.

(4) A digital-to-analog converter formed on a semiconductor substrate comprising:

a plurality of resistance strings which are provided between a terminal to which a low voltage is applied and a terminal to which a high voltage is applied and are connected in series, each of the resistance strings including a plurality of resistances connected in series, wherein the resistance strings to be connected at odd-numbered positions are arranged on the substrate in order of increasing in a direction from a near side of the terminal to which the low voltage is applied to the far side thereof, and the resistance strings to be connected at even-numbered positions are arranged on the substrate in order of increasing in a direction from the far side of the terminal to the near side;

a decoder which decodes input data to be converted; and a selection circuit which outputs a voltage at a junction point of the resistances constituting the resistance string in response to an output from the decoder.

(5) The digital-to-analog converter according to (4), wherein the resistor strings at the odd-numbered positions and the resistor strings at the even-numbered positions are alternately arranged.

(6) The digital-to-analog converter according to (4), wherein the resistor strings at the odd-numbered positions and the resistor strings at the even-numbered positions are respectively arranged side by side.

(7) A digital-to-analog converter formed on a semiconductor substrate comprising:

$2^n$ resistance strings which are arranged on the semiconductor substrate so as to orient in one direction and are provided between a terminal to which a low voltage is applied and a terminal to which a high voltage is applied and are connected in series, each of the resistance strings including a plurality of resistances connected in series, wherein at least two of the resistance strings which are not arranged adjacent to each other are directly electrically connected to each other, and wherein a voltage at a junction point of the resistances constituting the resistance string is selectively output in accordance with input data to be converted, where n is an integer not less than 2.

(8) A digital-to-analog converter formed on a semiconductor substrate comprising:

$2^n$ resistance strings which are arranged on the semiconductor substrate and are provided between a terminal to which a low voltage is applied and a terminal to which a high voltage is applied and are connected in series, each of the resistance strings including a plurality of resistances connected in series, wherein the $2^n$ resistance strings are electrically connected to each other so that a linearity error at junction points of the $2^n$ resistance strings becomes 0 at at least two junction points.

DETAILED DESCRIPTION OF PREFERRED EMBODIMENTS

Figure 1:
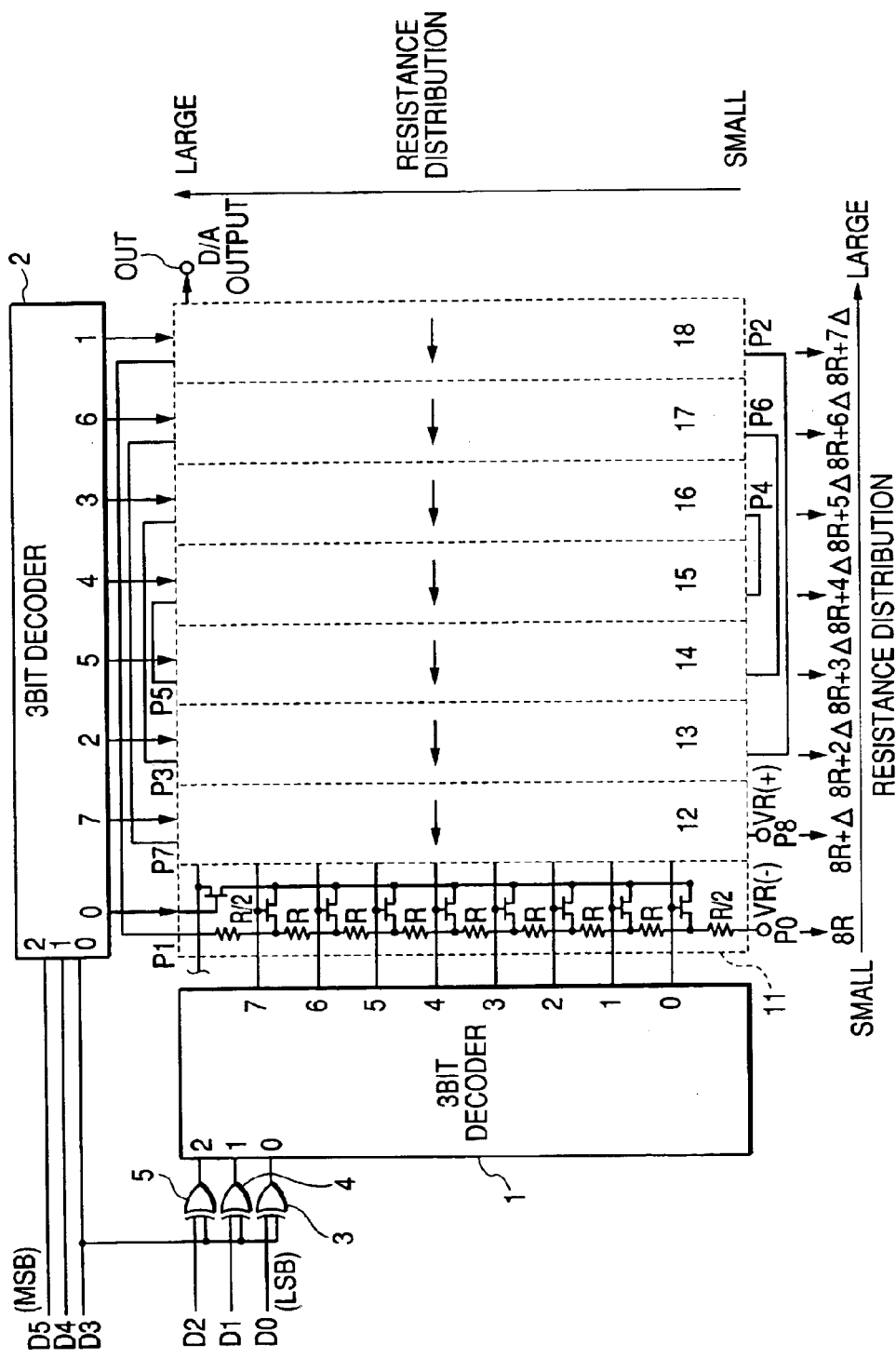
FIG. 1 is a block diagram showing the configuration of a D/A converter according to a first embodiment of the present invention.

The preferred embodiments of the present invention will now be described while referring to the drawings.

First Embodiment

FIG. 1 is a block diagram showing the configuration of a D/A converter according to a first embodiment of the invention. The D/A converter receives data to be converted (hereinafter referred to "conversion data") as a digital signal of six bits, converts this digital signal into an analog signal, and outputs the analog signal. In FIG. 1, reference numerals 1 and 2 denote 3-bit decoders, respectively. The 0-th bit D0 (LSB) to the second bit D2 of the conversion data are input to the input end of the decoder 1 through exclusive OR circuits 3 to 5, while the third bit D3 to the fifth bit D5 (MSB) of the conversion data are input to the input end of the decoder 2.

Voltage selection circuits 11 to 18 have the same structure, i.e., each includes a resistor string, which is formed by connecting nine resistors in series, and nine FETs (Field-Effect Transistors). In each of the voltage selection circuits 11 to 18 of the nine resistors constituting the resistor string, the uppermost resistor (the resistor at the top in FIG. 1) and the lowermost resistor (the resistor at the bottom in FIG. 1) have a resistance of R/2, while the other resistors have a resistance of R. The sources of the eight FETs are connected to the individual junction points of the resistors, and the drains of the FETs are connected in common to the source of the ninth FET.

The gates of the lowermost FETs of the voltage selection circuits 11 to 18 are connected to an output end 0 of the decoder 1, the gates of the second lowest FETs are connected to an output end 1 of the decoder 1, . . . , and the gates of the eighth lowest FETs are connected to an output end 7 of the decoder 1. The gates of the uppermost FETs of the voltage selection circuits 11 to 18 are respectively connected to output ends 0 to 7 of the decoder 2, and the drains of these FETs are connected to an output terminal OUT. A low voltage VR (−) is applied to an end P0 of the lowermost resistor of the voltage selection circuit 11, and a high voltage VR (+) is applied to an end P8 of the lowermost resistor of the voltage selection circuit 18. Between the end P0 of the voltage selection circuit 11 to which the low voltage VR (−) is applied, and the end P8 of the voltage selection circuit 18 to which the high voltage VR (+) is applied, the resistor strings of the voltage selection circuits 11 to 18 are connected through junction points P1, P2, P3, P4, P5, P6 and P7.

In this embodiment, the voltage selection circuits 11 to 18 are mounted, adjacent to each other, on a semiconductor substrate. As will be described later, resistor strings in the individual voltage selection circuits 11 to 18 are connected in series between a low voltage terminal P0 to which a low voltage VR (−) is applied, and a high voltage terminal P8 to which a high voltage VR (+) is applied. For this series connection, the odd number resistor strings to be connected in series are positioned on the substrate in order of increasing in a direction from a near side of the voltage terminal P0 to the far side, and the even number resistor strings to be connected are positioned on the substrate in order of increasing in a direction from a far side of the low voltage terminal P0 to the near side.

That is, the uppermost end of the resistor string of the voltage selection circuit 11 is connected to the uppermost end of the resistor string of the voltage selection circuit 18, and the lowermost end of the resistor string of the voltage selection circuit 18 is connected to the lowermost end of the resistor string of the voltage selection circuit 13. The uppermost end of the resistor string of the voltage selection circuit 13 is connected to the uppermost end of the resistor string of the voltage selection circuit 16, and the lowermost end of the resistor string of the voltage selection circuit 16 is connected to the lowermost end of the resistor string of the voltage selection circuit 15. The uppermost end of the resistor string of the voltage selection circuit 15 is connected to the uppermost end of the resistor string of the voltage selection circuit 14, and the lowermost end of the resistor string of the voltage selection circuit 14 is connected to the lowermost end of the resistor string of the voltage selection circuit 17. And the uppermost end of the resistor string of the voltage selection circuit 17 is connected to the uppermost end of the resistor string of the voltage selection circuit 12. A high voltage VR (+) is applied to a lowermost point P8 of the resistor string for the voltage selection circuit 12, and a low voltage VR (−) is applied to a lowermost point P0 of the resistor string for the voltage selection circuit 11. While output terminals 0 to 7 of the decoder 2 are respectively connected to the gates of the uppermost FETs of the voltage selection circuits 11, 18, 13, 16, 15, 14, 17 and 12.

For the connection of these resistor strings, the resistor strings of the voltage selection circuits 11 to 18 are rearranged in the order 11, 18, 13, 16, 15, 14, 17 and 12, and the adjacent resistor strings are sequentially connected. That is, the odd number resistor strings (the resistor strings 11, 13, 15 and 17) are arranged from left to right, i.e., in order of increasing in the direction from a near side of the point P0 to the far side, while the even number resistor strings (the resistor strings 12, 14, 16 and 18) are arranged from right to left, i.e., in order of increasing in a direction from a far side of the point P0 to the near side (in the direction of the array of the voltage selection circuits 11 to 18), and these resistor strings are alternately positioned. Of the voltage selection circuits 11 to 18 arranged in one direction, the voltage selection circuits 11, 18, 13 and 16 are respectively connected in series to the resistance string not adjacent to these circuits, while the voltage selection circuits 14, 17 and 12 are respectively connected in series to the resistance string not adjacent to these circuits.

With this configuration, based on the 0-th bit D0 to the second bit D2 of the conversion data, the decoder 1 turns on one of the FETs provided for each of the resistor strings of the voltage selection circuits 11 to 18. For example, when the value of the 0-th bit D0 to the second bit D2 of the conversion data is represented by "010" (2), the third lowest FETs of the individual resistor strings are turned on. Further, the decoder 2 selectively turns on the uppermost FET of one of the voltage selection circuits 11 to 18. For example, when the value of the third bit D3 to the fifth bit D5 of the input conversion data is represented by "100" (4), the uppermost FET of the voltage selection circuit 15 is turned on. Therefore, in this example, when conversion data (digital data) is "100010", a voltage-dividing-point voltage at the junction point for the third and fourth lowest resistors of the resistor string of the voltage selection circuit 15 is output to the output terminal OUT as a voltage to be transformed.

A linearity error for this embodiment will now be explained.

Figure 2:
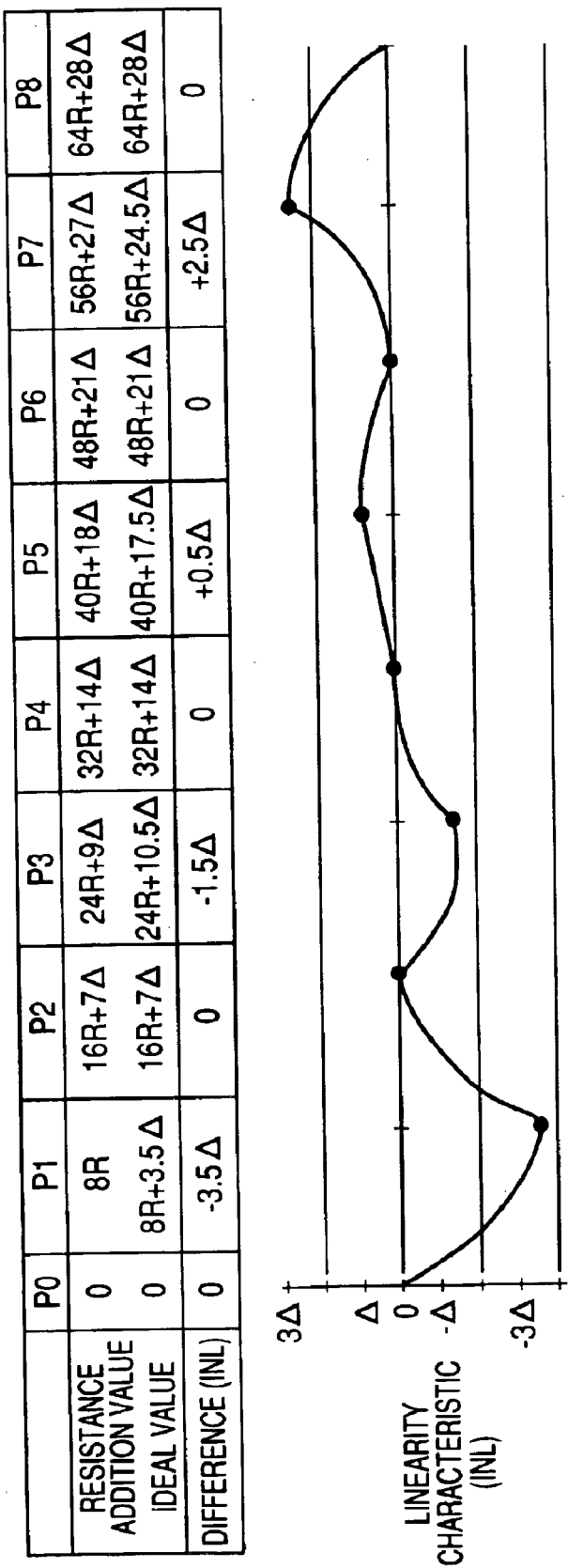
FIG. 2 is a diagram for explaining linearity errors for the D/A converter shown in FIG. 1.
Figure 3:
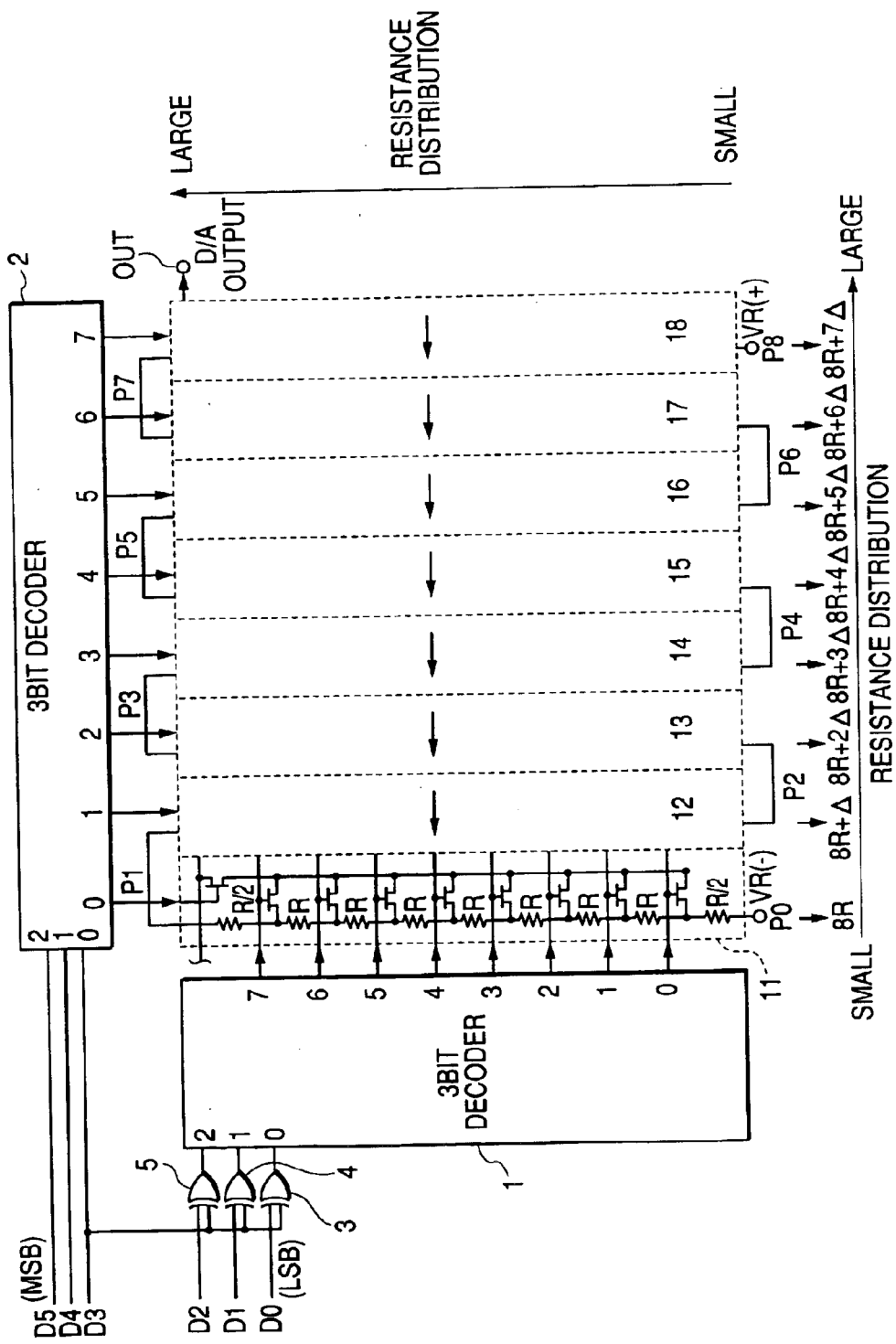
FIG. 3 is a block diagram showing the configuration of a conventional D/A converter.
Figure 4:
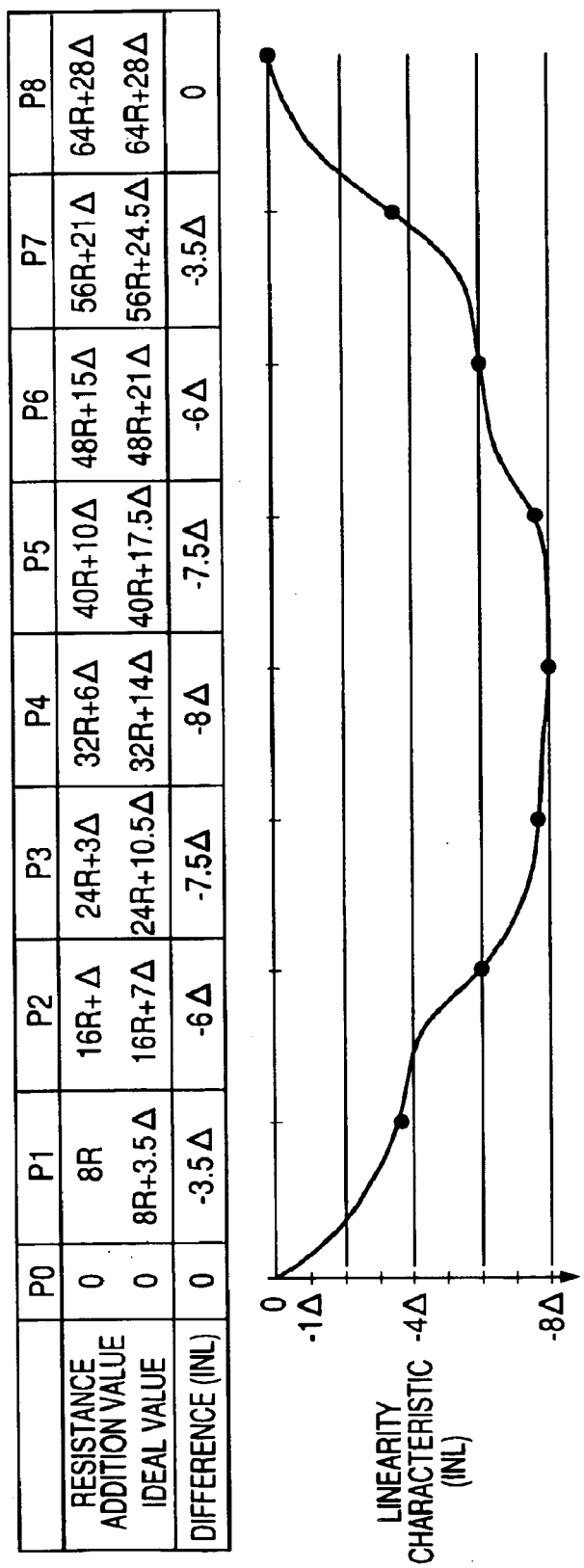
FIG. 4 is a diagram for explaining linearity errors for the D/A converter shown in FIG. 3.

Assume that, as well as for the example in FIG. 3, the resistances of the resistor strings for the voltage selection circuits 11 to 18 corresponds to 8R, 8R+Δ, 8R+2Δ, . . . and 8R+7Δ. For a junction point P1 between the uppermost end of the resistor string of the voltage selection circuit 11 and the uppermost end of the resistor string of the voltage selection circuit 18, a junction point P2 between the lowermost end of the resistor string for the voltage selection circuit 18 and the lowermost end of the resistor string for the voltage selection circuit 13, . . . and a junction point P7 between the uppermost end of the resistor string for the voltage selection circuit 17 and the uppermost end of the resistor string for the voltage selection circuit 12, the resistances relative to the point P0 are values identified as "resistance addition values" in FIG. 2. When the "ideal values" (see FIGS. 2 and 4) are subtracted from the resistances, the "differences" shown in FIG. 2 are obtained and can be represented graphically, as in FIG. 2.

As is apparent from this graph, for the D/A converter in this embodiment, the resistor strings of the voltage selection circuits 11 to 18 adjacently positioned in one direction need only be connected in the order described above, so that the influence of the gradient distribution of resistance errors due to the locations of the resistor strings arranged in the direction of the columns can be offset, and the linearity errors can be reduced to half, or fewer than the linearity error of the circuit in FIG. 3. Thus, conversion distortion can be reduced. Furthermore, there are few linearity errors near the center, and theoretically, the offset error can be reduced to zero. Since the D/A converter for this embodiment has a small offset error and low conversion distortion, this converter is appropriate for processing audio signals.

Compared with a conventional D/A converter, the circuit parts in the D/A converter according to the embodiment are unchanged, and only the order in which the wiring is performed is altered. Therefore, when a metal line provided for an upper layer is employed as resistor wiring for the resistors, circuit dimensions are not increased at all. Furthermore, although in this embodiment a digital signal of six bits is employed as an input signal, the number of bits that can be so employed is not limited to six. Thus, when there are n upper bits, $2^n$ voltage selection circuits must be provided, but in this case, the same connections can be employed as are used for the embodiment. The order of wiring resistance strings is not limited to the above embodiment. In the resistance string of the plurality of voltage selection circuit arranged in one direction, the linearity error can be appropriately reduced by connecting at least two of the resistance strings, which are not arranged adjacent to each other, to each other in series.

Second Embodiment

Figure 5:
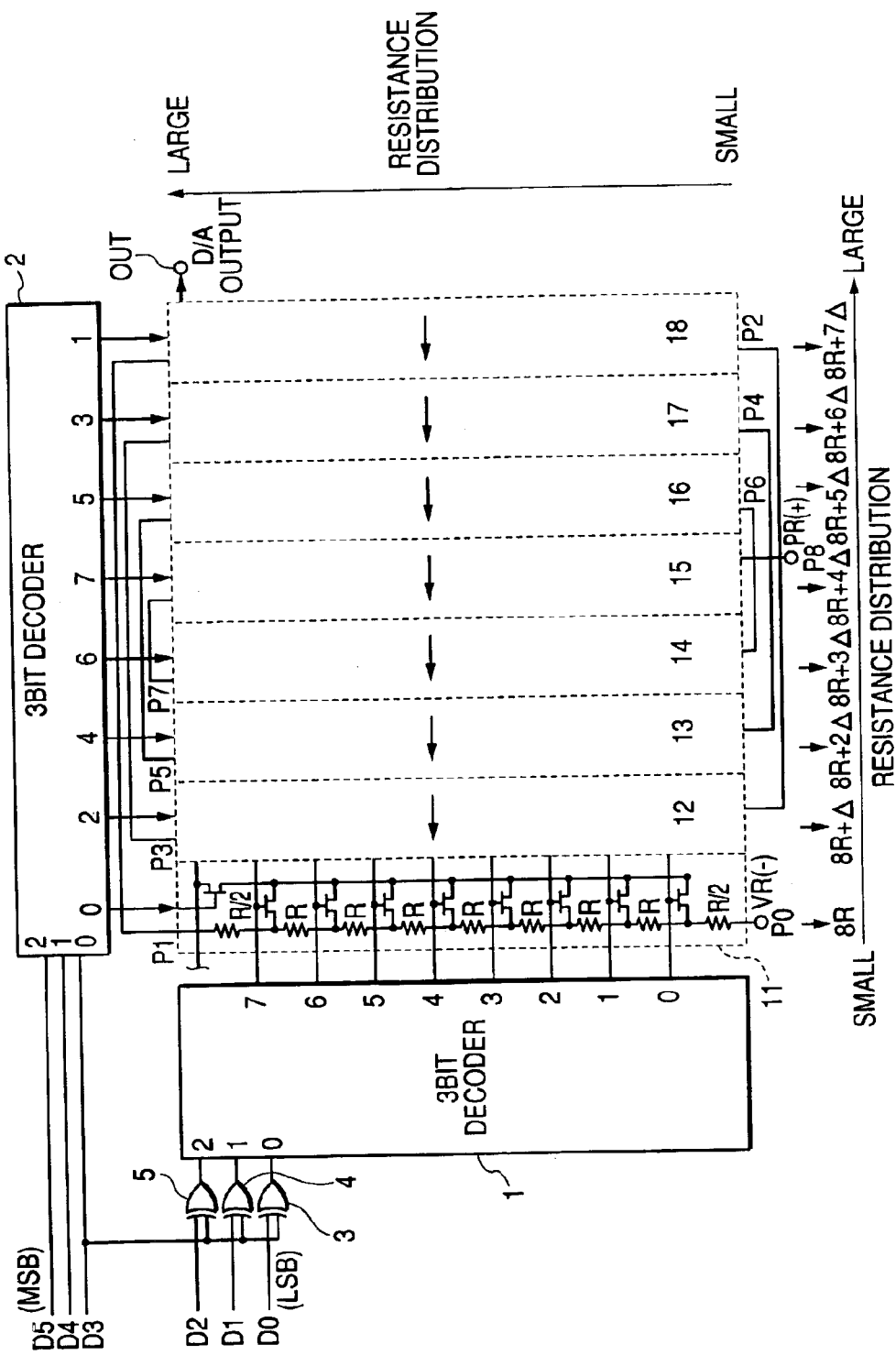
FIG. 5 is a block diagram showing the configuration of a D/A converter according to a second embodiment of the present invention.

FIG. 5 is a block diagram showing the configuration of a D/A converter according to a second embodiment of the invention. The second embodiment differs from the first embodiment in a connecting fashion of each resistor strings of the voltage selection circuit. Therefore, the connecting fashion of the second embodiment will be mainly described hereinafter.

That is, the uppermost end of the resistor string of the voltage selection circuit 11 is connected to the uppermost end of the resistor string of the voltage selection circuit 18, and the lowermost end of the resistor string of the voltage selection circuit 18 is connected to the lowermost end of the resistor string of the voltage selection circuit 12. The uppermost end of the resistor string of the voltage selection circuit 12 is connected to the uppermost end of the resistor string of the voltage selection circuit 17, and the lowermost end of the resistor string of the voltage selection circuit 17 is connected to the lowermost end of the resistor string of the voltage selection circuit 13. The uppermost end of the resistor string of the voltage selection circuit 13 is connected to the uppermost end of the resistor string of the voltage selection circuit 16, and the lowermost end of the resistor string of the voltage selection circuit 16 is connected to the lowermost end of the resistor string of the voltage selection circuit 14. And the uppermost end of the resistor string of the voltage selection circuit 14 is connected to the uppermost end of the resistor string of the voltage selection circuit 15. A high voltage VR (+) is applied to a lowermost point P8 of the resistor string for the voltage selection circuit 15, and a low voltage VR (−) is applied to a lowermost point P0 of the resistor string for the voltage selection circuit 11. The output terminals 0 to 7 of the decoder 2 are respectively connected to the gates of the uppermost FETs of the voltage selection circuits 11, 18, 12, 17, 13, 16, 14 and 15.

For the connection of these resistor strings, the resistor strings of the voltage selection circuits 11 to 18 are rearranged in the order (11, 18), (12, 17), (13, 16) and (14, 15), and the adjacent resistor strings are sequentially connected. In other words, the odd number resistor strings (the resistor strings 11, 13, 15 and 17) are arranged side by side from left to right, i.e., in order of increasing in the direction from a near side of the point P0 to the far side, while the even number resistor strings (the resistor strings 12, 14, 16 and 18) are arranged side by side from right to left, i.e., in order of increasing in a direction from a far side of the point P0 to the near side (in the direction of the array of the voltage selection circuits 11 to 18). That is, while in the first embodiment, the odd number resistor strings and the even number resistor strings are alternately positioned, in the second embodiment, pairs, each consisting of the odd number resistor string and the even number resistor string (for example, (11, 18), (12, 17) and the like), are arranged side by side (adjacent to each other).

The D/A converter according to the second embodiment is operated in same manner to the circuit according to the first embodiment.

Figure 6:
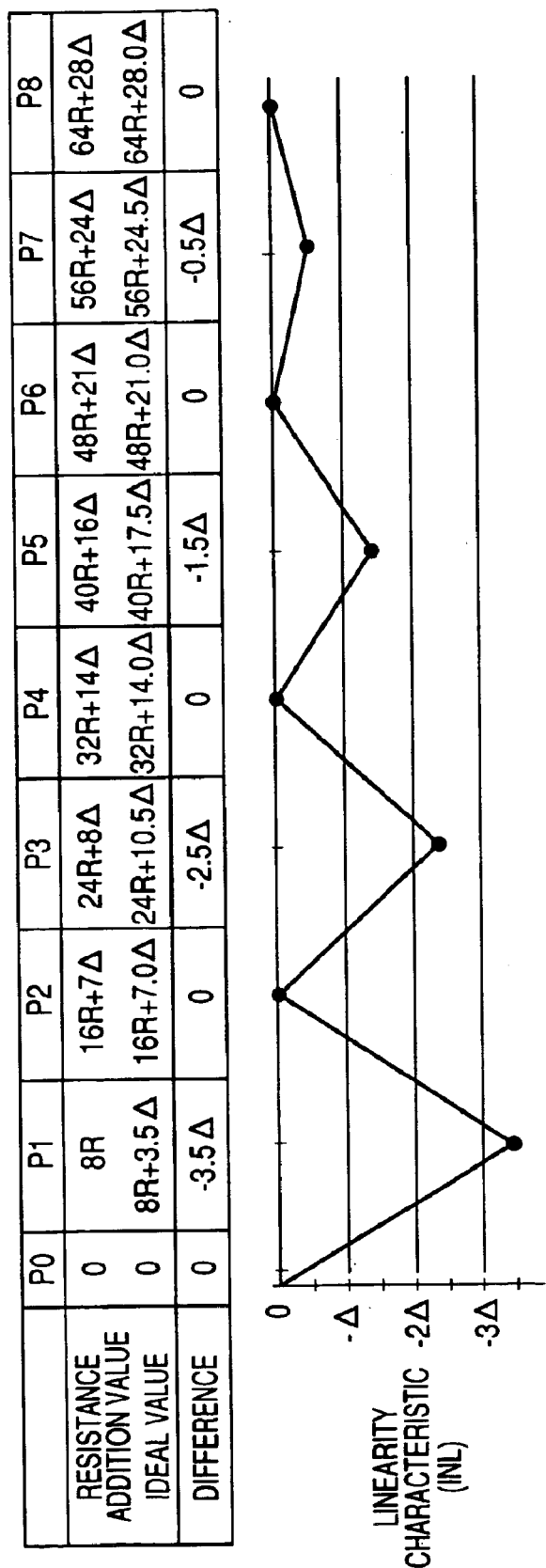
FIG. 6 is a diagram for explaining linearity errors for the D/A converter shown in FIG. 5.

With respect to the linearity error, "resistance addition values" and "differences" and a graph showing "differences" are shown in FIG. 6. As is apparent from the graph of FIG. 6, similar to the first embodiment the linearity errors can be reduced to half, or fewer than the linearity error of the circuit in FIG. 3, and conversion distortion can be reduced. As shown in FIG. 6, in the second embodiment, reduction of the linearity error is apparent in a high-voltage side.

The linearity error at the low-voltage side can be remarkably reduced by changing the lower voltage (−) and the high voltage (+) of the circuit according to the second embodiment. Accordingly, a circuit designer can design a high quality circuit by using an appropriate circuit selected from the first and second embodiment according to an application of the D/A converter.

As described above, according to the invention, the number of linearity errors can be reduced more than in the conventional case, without increasing the circuit dimensions.

What is claimed is:

1. A digital-to-analog converter formed on a semiconductor substrate comprising:

at least four resistor strings which are provided between a terminal to which a low voltage is applied and a terminal to which a high voltage is applied and are connected in series, each of the resistor strings including a plurality of resistances connected in series, wherein the resistor strings to be connected at odd-numbered positions are arranged on the substrate in order of increasing resistance in a direction from a near side of the terminal to which the low voltage is applied to the far side thereof, and the resistor strings to be connected at even-numbered positions are arranged on the substrate in order of increasing resistance in a direction from the far side of the terminal to the near side, wherein a voltage at a junction point of the resistances constituting the resistor strings is selectively output in accordance with input data to be converted.

2. A digital-to-analog converter formed on a semiconductor substrate comprising:

a plurality of resistor strings which are provided between a terminal to which a low voltage is applied and a terminal to which a high voltage is applied and are connected in series, each of the resistor strings including a plurality of resistances connected in series, the resistor strings to be connected at odd-numbered positions are arranged on the substrate in order of increasing resistance in a direction from a near side of the terminal to which the low voltage is applied to the far side thereof, and the resistor strings to be connected at even-numbered positions are arranged on the substrate in order of increasing resistance in a direction from the far side of the terminal to the near side, the resistor strings at the odd-numbered positions and the resistor strings at the even-numbered positions are alternately arranged, wherein a voltage at a junction point of the resistances constituting the resistor strings is selectively output in accordance with input data to be converted.

3. A digital-to-analog converter formed on a semiconductor substrate comprising:

a plurality of resistor strings which are provided between a terminal to which a low voltage is applied and a terminal to which a high voltage is applied and are connected in series, each of the resistor strings including a plurality of resistances connected in series, the resistor strings to be connected at odd-numbered positions are arranged on the substrate in order of increasing resistance in a direction from a near side of the terminal to which the low voltage is applied to the far side thereof, and the resistor strings to be connected at even-numbered positions are arranged on the substrate in order of increasing resistance in a direction from the far side of the terminal to the near side, the resistor strings at the odd-numbered positions and the resistor strings at the even-numbered positions are respectively arranged side by side, wherein a voltage at a junction point of the resistances constituting the resistor strings is selectively output in accordance with input data to be converted.

4. A digital-to-analog converter formed on a semiconductor substrate comprising:

at least four resistor strings which are provided between a terminal to which a low voltage is applied and a terminal to which a high voltage is applied and are connected in series, each of the resistor strings including a plurality of resistances connected in series, wherein the resistor strings to be connected at odd-numbered positions are arranged on the substrate in order of increasing resistance in a direction from a near side of the terminal to which the low voltage is applied to the far side thereof, and the resistor strings to be connected at even-numbered positions are arranged on the substrate in order of increasing resistance in a direction from the far side of the terminal to the near side;

a decoder which decodes input data to be converted; and a selection circuit which outputs a voltage at a junction point of the resistances constituting the resistor strings in response to an output from the decoder.

5. A digital-to-analog converter formed on a semiconductor substrate comprising:

a plurality of resistor strings which are provided between a terminal to which a low voltage is applied and a terminal to which a high voltage is applied and are connected in series, each of the resistor strings including a plurality of resistances connected in series, wherein the resistor strings to be connected at odd-numbered positions are arranged on the substrate in order of increasing resistance in a direction from a near side of the terminal to which the low voltage is applied to the far side thereof, and the resistor strings to be connected at even-numbered positions are arranged on the substrate in order of increasing resistance in a direction from the far side of the terminal to the near side, the resistor strings at the odd-numbered positions and the resistor strings at the even-numbered positions are alternately arranged;

a decoder which decodes input data to be converted; and a selection circuit which outputs a voltage at a junction point of the resistances constituting the resistor strings in response to an output from the decoder.

6. A digital-to-analog converter formed on a semiconductor substrate comprising:

a plurality of resistor strings which are provided between a terminal to which a low voltage is applied and a terminal to which a high voltage is applied and are connected in series, each of the resistor strings including a plurality of resistances connected in series, wherein the resistor strings to be connected at odd-numbered positions are arranged on the substrate in order of increasing resistance in a direction from a near side of the terminal to which the low voltage is applied to the far side thereof, and the resistor strings to be connected at even-numbered positions are arranged on the substrate in order of increasing resistance in a direction from the far side of the terminal to the near side, the resistor strings at the odd-numbered positions and the resistor strings at the even-numbered positions are respectively arranged side by side;

a decoder which decodes input data to be converted; and a selection circuit which outputs a voltage at a junction point of the resistances constituting the resistor strings in response to an output from the decoder.

7. A digital-to-analog converter formed on a semiconductor substrate comprising:

at least four resistor strings which are arranged on the semiconductor substrate so as to orient in one direction and are provided between a terminal to which a low voltage is applied and a terminal to which a high voltage is applied and are connected in series, each of the resistor strings including a plurality of resistances connected in series, wherein at least two of the resistor strings which are not arranged adjacent to each other are directly electrically connected to each other, and wherein a voltage at a junction point of the resistances constituting the resistor resistor is selectively output in accordance with input data to be converted.

8. A digital-to-analog converter formed on a semiconductor substrate comprising:

at least four resistor strings which are arranged on the semiconductor substrate and are provided between a terminal to which a low voltage is applied and a terminal to which high voltage is applied and are connected in series, each of the resistor strings including a plurality of resistances connected in series, wherein the at least four resistor strings are electrically connected to each other so that a linearity error at junction points of the at least four resistor strings becomes 0 at least two junction points.

9. A digital-to-analog converter formed on a semiconductor substrate comprising:

a plurality of resistor strings which are provided between a terminal to which a low voltage is applied and a terminal to which a high voltage is applied and are connected in series, each of the resistor strings including a plurality of resistances connected in series, wherein the resistor strings to be connected at odd-numbered positions are arranged on the substrate in order of increasing resistance in a direction from a near side of the terminal to which the low voltage is applied to the far side thereof, and the resistor strings to be connected at even-numbered positions are arranged on the substrate in order of increasing resistance in a direction from the far side of the terminal to the near side, wherein a voltage at a junction point of the resistances constituting the resistor strings is selectively output in accordance with input data to be converted.

* * * * *